(12) United States Patent
Lian

(10) Patent No.: US 7,898,802 B2
(45) Date of Patent: Mar. 1, 2011

(54) ELECTRONIC DEVICE HAVING SLIDING ASSEMBLY

(75) Inventor: Chia-Ruei Lian, Yilan County (TW)

(73) Assignee: Micro-Star Int'l Co., Ltd., Jung-He (TW)

( * ) Notice: Subject to any disclaimer, the term of this patent is extended or adjusted under 35 U.S.C. 154(b) by 78 days.

(21) Appl. No.: 12/539,130

(22) Filed: Aug. 11, 2009

(65) Prior Publication Data

US 2010/0149752 A1    Jun. 17, 2010

(30) Foreign Application Priority Data

Dec. 12, 2008   (TW) .............................. 97148664 A

(51) Int. Cl.
G06F 1/16   (2006.01)

(52) U.S. Cl. ................................ 361/679.59; 108/50.01

(58) Field of Classification Search ............. 361/679.59; 108/50.01
See application file for complete search history.

(56) References Cited

U.S. PATENT DOCUMENTS

| | | | | |
|---|---|---|---|---|
| 4,693,444 A * | 9/1987 | Williams et al. ................ 108/7 |
| 4,951,241 A * | 8/1990 | Hosoi et al. ............. 361/679.59 |
| 5,111,361 A * | 5/1992 | Kobayashi .................... 108/132 |
| 5,818,690 A * | 10/1998 | Spencer .................... 361/679.59 |
| 5,918,957 A * | 7/1999 | Bovio et al. ............. 361/679.59 |
| 6,053,589 A * | 4/2000 | Lin .......................... 361/679.59 |
| 6,097,592 A * | 8/2000 | Seo et al. ................. 361/679.59 |
| 6,842,337 B2 * | 1/2005 | Helot et al. .............. 361/679.59 |
| 7,679,905 B2 * | 3/2010 | Wu et al. .................. 361/679.59 |
| 7,715,190 B2 * | 5/2010 | Tang ........................ 361/679.59 |
| 7,746,636 B2 * | 6/2010 | Tang ........................ 361/679.59 |
| 7,821,786 B2 * | 10/2010 | Hadad et al. ............. 361/679.59 |
| 2009/0175001 A1 * | 7/2009 | Mathew et al. .......... 361/679.59 |
| 2010/0064944 A1 * | 3/2010 | Su .............................. 108/50.01 |

* cited by examiner

*Primary Examiner* — Lisa Lea-Edmonds

(74) *Attorney, Agent, or Firm* — Rabin & Berdo, P.C.

(57) ABSTRACT

An electronic device having a sliding assembly is described. A cantilever having a slide-proof pad is disposed on a bottom surface of a casing, and a sliding assembly corresponding to the cantilever is disposed in the casing. When the casing is pressed, the sliding assembly extends outside the slide-proof pad through an elastic displacement of the cantilever, such that the sliding assembly supports the casing to a higher position, and the casing slides on and contacts with a plane through the sliding assembly; alternatively, the sliding assembly retracts into the slide-proof pad, such that the slide-proof pad contacts with the plane, and the casing does not slide freely on the plane through interference contact of the slide-proof pad.

8 Claims, 9 Drawing Sheets

ELECTRONIC DEVICE HAVING SLIDING ASSEMBLY

CROSS-REFERENCE TO RELATED APPLICATIONS

This non-provisional application claims priority under 35 U.S.C. §119(a) on Patent Application No(s). 097148664 filed in Taiwan, R.O.C. on Dec. 12, 2008 the entire contents of which are hereby incorporated by reference.

BACKGROUND OF THE INVENTION

1. Field of Invention

The present invention relates to a sliding adjustment structure, and more particularly to an electronic device having a sliding assembly.

2. Related Art

With the development of electronic technology, in consideration of the convenience and usefulness, most electronic devices in the market are designed light, thin, short, and small, such that the electronic devices can be taken around by users, and can be integrated into the working environment rapidly to improve the flexibility in use. A notebook computer is a typical example of the electronic devices. Normally, electronic elements and components such as the mainboard, processor, and memory are disposed in a casing of a notebook computer for executing the functions of the notebook computer. When the notebook computer is placed on a table, to prevent the casing from directly contacting with the table and to provide a space for heat dissipation, rubber strips or pads having a slide-proof function are disposed on an edge of a bottom of the casing, such that the casing of the notebook computer is slightly supported higher, and thus, the heat dissipation efficiency is improved, and the notebook computer will not slide freely in operation.

Taking a notebook computer for example, the average weight of the notebook computer is between 1 kg and 2 kg, and rubber strips or pads are disposed on the bottom of the casing of the notebook computer. Generally, the rubber strips or pads are made of a rubber material having a high friction coefficient, and are fabricated to round block or rectangular blocks. The rubber strips or pads support the notebook computer to a higher position, and prevent the notebook computer from sliding. However, when the notebook computer needs to be moved around, for example, when the notebook computer is used as a presentation media for presenting images to the audience, the notebook computer must be turned around frequently to show the displayed images on the screen to the audience. At this time, the rubber strips or pads having the high friction coefficient make it difficult for the user to move the notebook computer, as the user needs to apply more force to move the computer, and the pads of the computer may get damaged due to the improper push or movement. Accordingly, the table surface may also be scratched.

Further, when the user places the notebook computer on the table, the user sometimes may adjust the optimal viewing position for viewing the screen and adjust the optimal relative position for pressing the keys with fingers. As the bottom of the casing does not have an appropriate auxiliary design, the user must lift the notebook computer away from the table surface to adjust the position in time, so as to adjust the screen to the optimal viewing position. Though the notebook computer is moved for a short distance, it is still very difficult for an elderly or child. In addition, the user may have to try several times to adjust the notebook computer to the optimal viewing position and the optimal position for operating the keyboard.

Thus, the rubber strips or pads on the bottom of the casing made of a material having a low friction coefficient are used to provide a design having a low slide-proof effect, which enables the user to slightly move the notebook computer on the table surface more conveniently. However, after long use, the slide-proof rubber strips or pads may be abraded or even fall off from the bottom, such that the slide-proof structure design becomes meaningless.

Therefore, some manufacturers add a sliding assembly on the bottom of the casing of the notebook computer. The sliding assembly includes a groove disposed on the bottom of the casing and a sliding member in the groove. The sliding member is pivoted inside the groove, such that the sliding member has a sector-shaped swing displacement in the groove. When the sliding member is not used, the moving member is accommodated in the groove, and pads are used as the slide-proof structure. When the sliding member is used, the user may pull the sliding member to the outside, such that an angle is formed between the sliding member and the casing. Thus, the sliding member supports the notebook computer higher, the pads leave the table surface, and balls on the sliding member directly contact with the surface. At this time, the notebook computer may slide to the optimal relative position through the balls of the sliding member.

Another sliding assembly is disposed on the notebook computer. A plurality of rollers is disposed on the bottom of the casing of the notebook computer, and pushes the casing to slide on a plane. A slide-proof structure is used as a brake of the rollers. The slide-proof structure includes at least one swing arm, which is pivoted on the casing, and may extend out of or retracts into a hole in the bottom of the casing. When the swing arm turns and extends out of the hole in the bottom of the casing, the swing arm supports the casing up on the plane, such that the rollers are away from the plane, and a bottom surface of the swing arm and the plane form the interference contact. When the casing needs to slide again, the swing arm is pulled to retract into the hole, such that the casing may slide on the plane through the rollers.

However, a sector-shaped turning travel is required in the two conventional designs, while the internal space of the casing is quite limited in the current structural design of notebook computers. The conventional designs must expand the internal space of the casing to accommodate the elements and the sector-shaped turning travel, so the structure of the casing cannot be miniaturized. Therefore, a structural design that enables a notebook computer to slide without lifting the notebook computer up is required.

SUMMARY OF THE INVENTION

Currently, a conventional sliding assembly of a notebook computer has a problem that the notebook computer must be lifted up to adjust the sliding assembly on a bottom surface of the notebook computer, so the operation is quite inconvenient. Accordingly, the present invention is directed to an electronic device having a sliding assembly. After a casing of a notebook computer is pressed, a movable member on a bottom of the casing is ejected out, such that the casing is supported to a higher position on a plane, and the casing may move on the plane through a sliding member. Thus, the problem in the conventional art is solved.

The electronic device having a sliding assembly provided in the present invention includes a casing and a sliding assembly. A bottom surface of the casing has a groove, and a cantilever having a through hole is disposed on the bottom surface of the casing. The cantilever has a swing displacement relative to the groove. Further, a slide-proof pad is disposed on the cantilever, such that the cantilever has a blocked position where the slide-proof pad contacts with a plane and an evading position where the slide-proof pad retracts into the casing.

The sliding assembly is disposed on the casing, and is corresponding to the cantilever. The sliding assembly has a cylinder and a movable member. The cylinder is fixed to the casing, and the movable member is movably disposed on the cylinder, and is corresponding to the through hole of the cantilever, such that the movable member may have a displacement relative to the cylinder and move to a first position, a second position, and a third position. When the movable member is at the first position, the cantilever enables the slide-proof pad to remain at the blocked position. When the movable member is at the second position, the cantilever enables the slide-proof pad to remain at the evading position. When the movable member is at the third position, the movable member supports the casing higher and enables the slide-proof pad to be away from the plane, such that the movable member and the plane have a sliding contact, and the casing has a displacement on the plane.

The efficacy of the electronic device having a sliding assembly of the present invention is as follows. When a side edge of the casing is pressed, the sliding assembly may start to move through elastic displacement of the cantilever, such that the movable member of the sliding assembly extends outside or retracts into the slide-proof pad. A user may push the casing to move when the movable member extends outside the slide-proof pad, or fix the casing at an optimal using position on the plane when the movable member retracts into the slide-proof pad.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
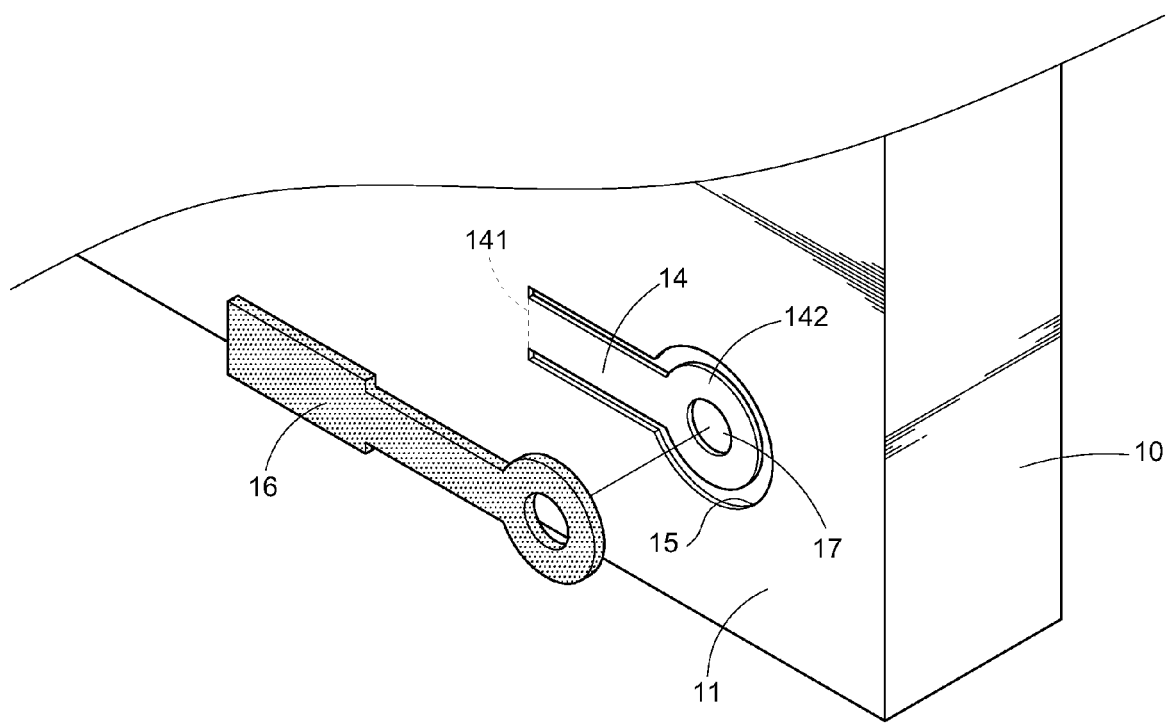
FIG. 1 is a partial schematic outside view of an elastic pressing component according to the present invention.
Figure 2:
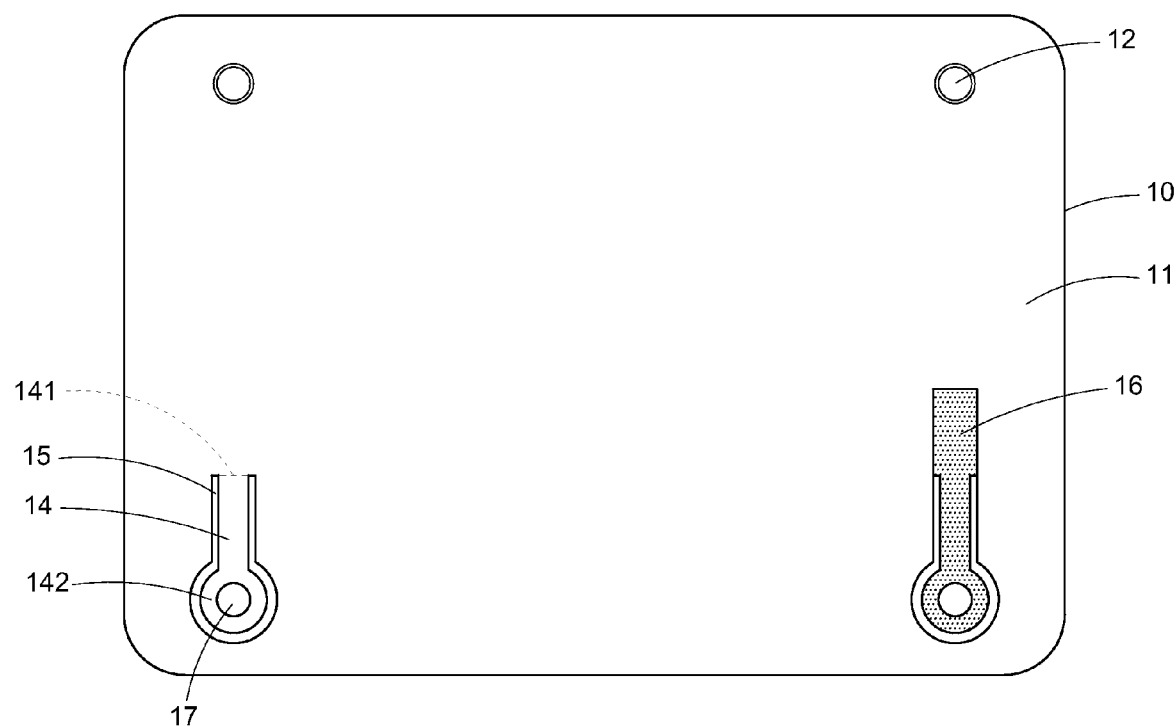
FIG. 2 is a schematic view of a bottom surface of a casing according to the present invention.

The electronic device having a sliding assembly of the present invention includes, but not limited to, a computer input device for a user to operate, such as a notebook computer, a tablet PC, or an ultra mobile PC (UMPC). In the following embodiment of the present invention, a notebook computer is taken as an example. Certainly, the applicable products and scope of the present invention are not limited by the following embodiment.

Referring to the schematic views of FIGS. 1-3C, the electronic device having a sliding assembly of the present invention is a notebook computer. The notebook computer uses the conventional art, and is not described in detail here. A sliding assembly 20 is disposed on a bottom of a casing 10 of the notebook computer. A rolling component 12 and a groove 13 are disposed on a bottom surface 11 of the casing 10. The rolling component 12 is disposed on a side of the bottom surface 11 of the casing 10, and may rotate freely. An outer diameter of the rolling component 12 must be greater than an inner diameter of a slot 111 for accommodating the rolling component 12, such that the rolling component 12 does not fall out of the slot 111. At least one-fourth of the rolling component 12 protrudes outside the slot 111, such that the protruded surface of the rolling component 12 contacts with a plane 30. Further, the groove 13 is disposed on the other side of the bottom surface 11, such that the rolling component 12 and the groove 13 are located on two opposite sides of the bottom surface 11 respectively.

Moreover, a cantilever 14 is disposed on the bottom surface 11 at a position corresponding to the groove 13, and a cut groove 15 is arranged around the cantilever 14. The cantilever 14 has a fixed end 141 and a movable end 142. The fixed end 141 of the cantilever 14 is connected to the casing 10, and the cut groove 15 enables the movable end 142 of the cantilever 14 have a swing displacement up and down on the bottom surface 11. A slide-proof pad 16 is disposed on a bottom of the cantilever 14. The slide-proof pad 16 is made of a material having a high friction coefficient, and a bottom surface of the slide-proof pad 16 is at the same level as a bottom surface of the rolling component 12.

The movable end 142 of the cantilever 14 is substantially arc-shaped, and is corresponding to an opening of the groove 13. A through hole 17 passes through the movable end 142 of the cantilever 14 and the slide-proof pad 16, and is corresponding to the groove 13.

The sliding assembly 20 is disposed in the groove 13 of the casing 10, and includes a cylinder 21, a movable member 22, and a telescopic component 23. The cylinder 21 is fixed inside the groove 13, and accommodates the movable member 22 and the telescopic component 23. The telescopic component 23 actuates the movable member 22 to have a sliding displacement relative to the cylinder 21, such that the movable member 22 may retract into the through hole 17 or extends outside the through hole 17.

Figure 5:
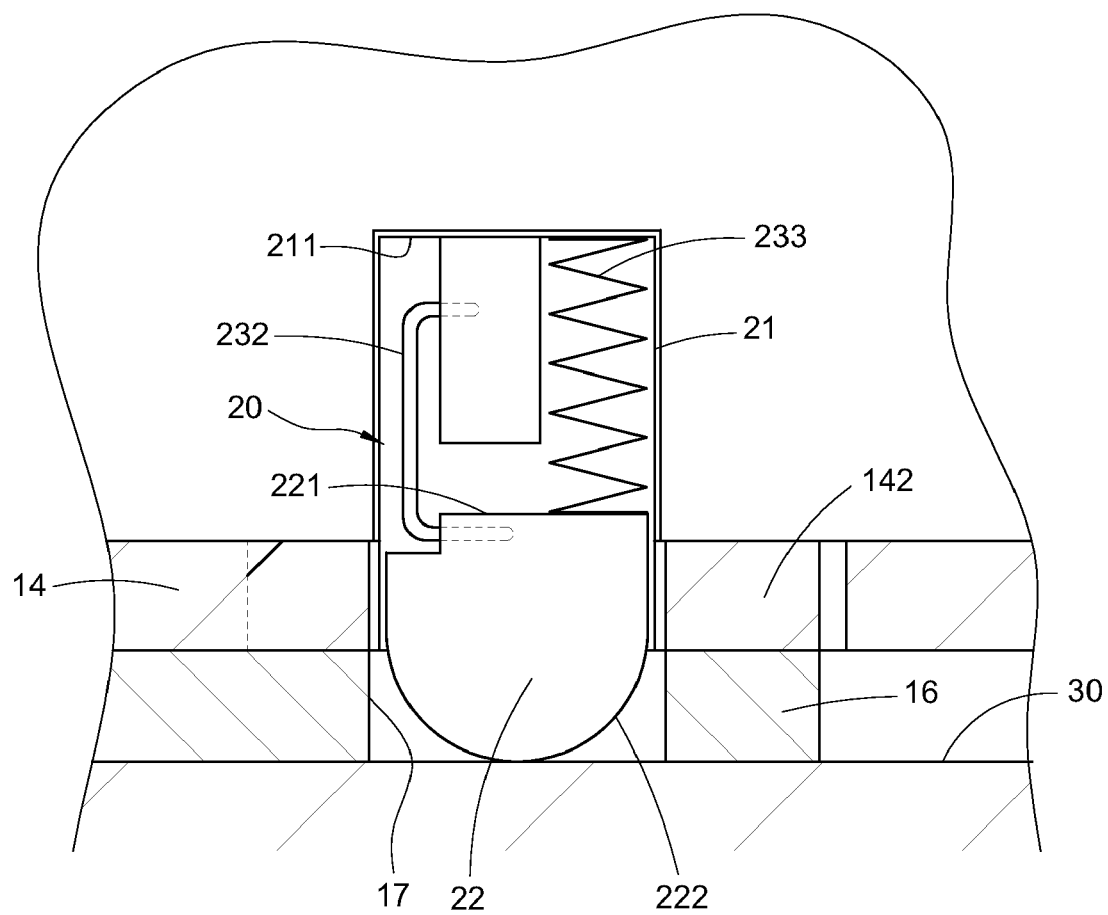
FIG. 5 is a partial schematic enlarged side view of the movable member according to the present invention.

The telescopic component 23 includes a circulating guide groove 231, a guide rod 232, and an elastic element 233. The circulating guide groove 231 is disposed on an inner wall of the cylinder 21, and fixes the guide rod 232 on the circulating guide groove 231. An end of the guide rod 232 is fixedly connected to the movable member 22, and the other end of the guide rod 232 is movably positioned in the circulating guide groove 231 to have a reciprocal displacement. The detailed function of the circulating guide groove 231 will be described in the following. Further, the elastic element 233 is accommodated in the cylinder 21, and two ends of the elastic element 233 press against a wall 211 of the cylinder 21 and a bearing surface 221 on a side of the movable member 22 respectively (as shown in FIG. 5). The elastic element 233 normally presses the movable member 22 outwards, and pulls the movable member 22 through the guide rod 232, so as to limit the displacement travel of the movable member 22. The other side of the movable member 22 away from the bearing surface 221 has a contact surface 222. The movable member 22 is made of a material having a low friction coefficient.

Referring to the schematic views of FIGS. 3A, 3B, and 3C, the operation principle of the electronic device having a sliding assembly of the present invention is as follows. The displacement of the movable member 22 drives the guide rod 232 to perform a sliding motion including pressing and positioning in the circulating guide groove 231, so as to provide at least the following four motion states.

Figure 3A:
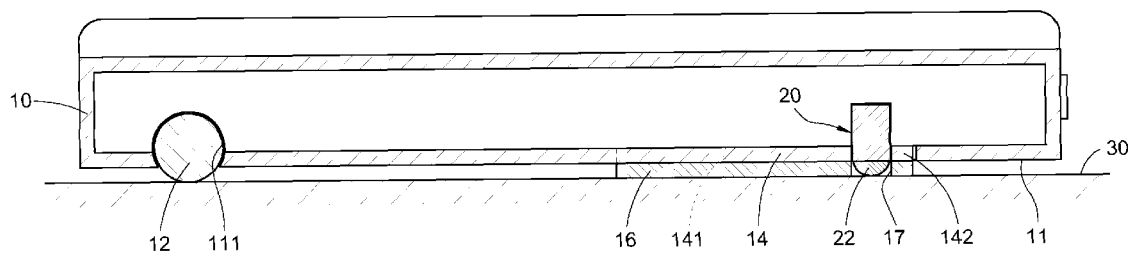
FIG. 3A is a schematic side view of the present invention before the casing is pressed.

In the first motion state, as shown in FIG. 3A, when the casing 10 is placed on a plane 30, the cantilever 14 has a blocked position where the slide-proof pad 16 contacts with the plane 30. Therefore, a high frictional resistance is formed through the tight contact between the slide-proof pad 16 and the plane 30, so as to firmly fix the casing 10 on the plane 30 and prevent the casing 10 from sliding freely.

Figure 4A:
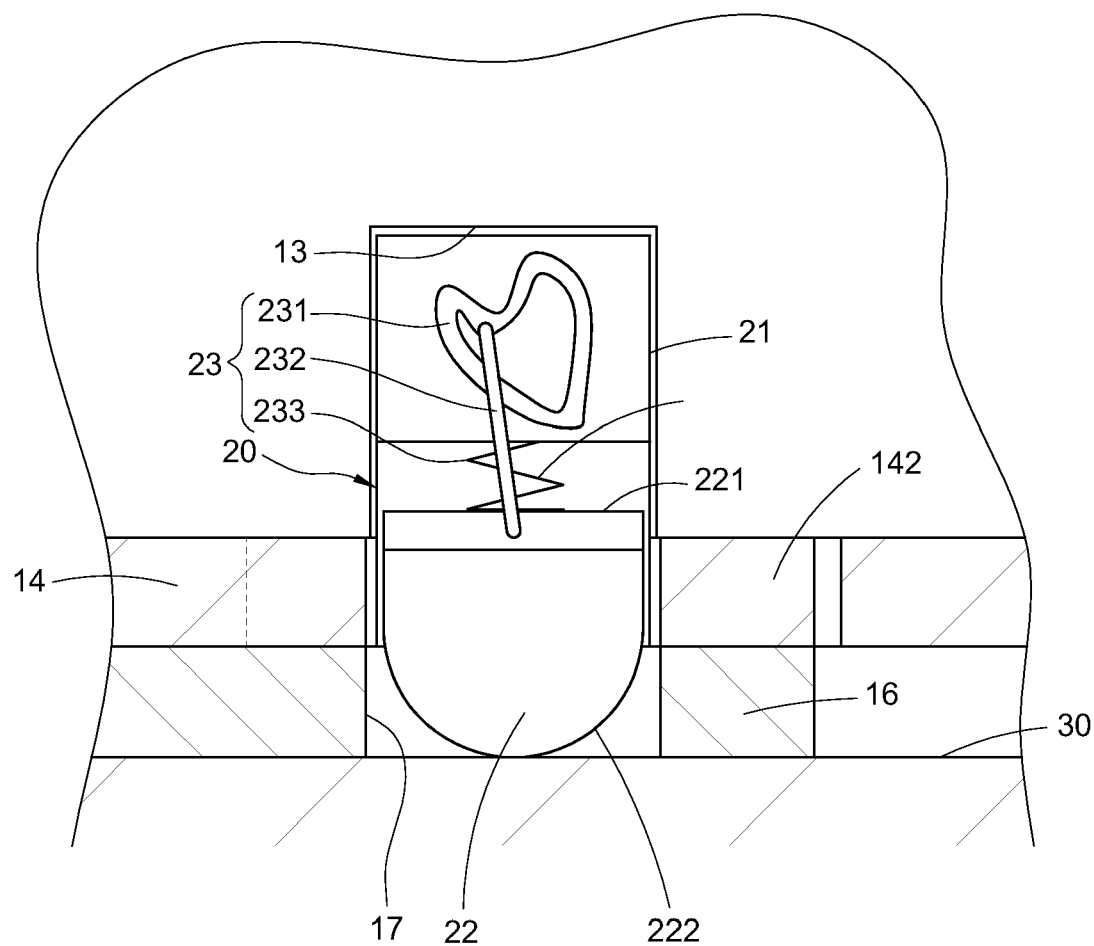
FIG. 4A is a partial schematic enlarged view of a movable member according to the present invention before the movable member is actuated.

At this time, the movable member 22 is located in the through hole 17, and is at a first position (normal position). The contact surface 222 of the movable member 22 contacts with the plane 30, and the guide rod 232 of the telescopic component 23 is located at a first positioning end 2311 in the circulating guide groove 231, so as to form a positioning state (as shown in FIG. 4A).

Figure 3B:
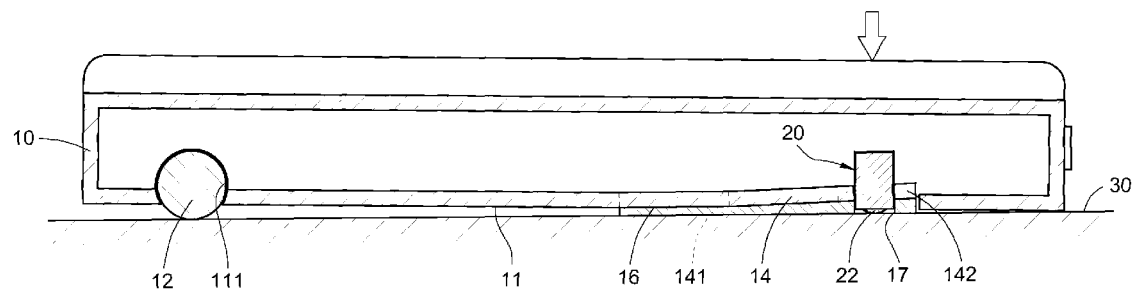
FIG. 3B is a schematic side view of the present invention when the casing is pressed.
Figure 3C:
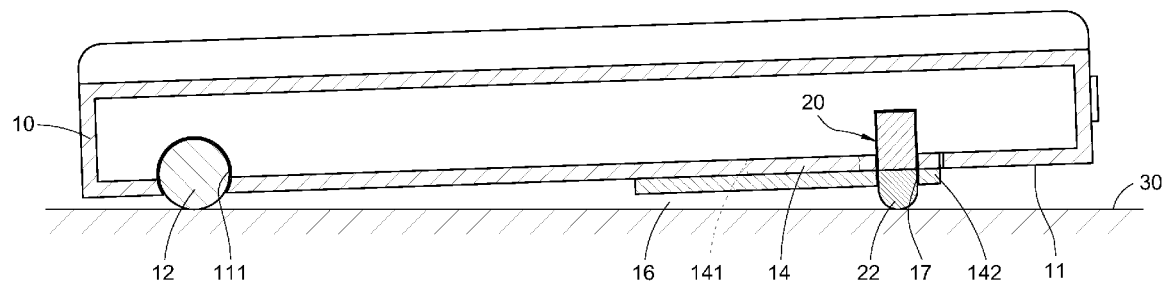
FIG. 3C is a schematic side view of the present invention after the casing is pressed.

In a second motion state, as shown in FIG. 3B, when the user needs to move the casing 10 of the notebook computer, the user may apply a pressing force downwards on the edge of the casing 10, and after the casing 10 is pressed down slightly, a counterforce is generated on the plane 30 by the slide-proof pad 16. The counterforce of the slide-proof pad 16 actuates the cantilever 14 to have an elastic displacement upwards, such that the cantilever 14 is at an evading position where the slide-proof pad 16 retracts into the casing 10. Then, the elastic displacement travel applies a force on the movable member 22, such that the movable member 22 moves to a second position (pressed position), and pushes the guide rod 232 of the telescopic component 23 to start to move.

Figure 4B:
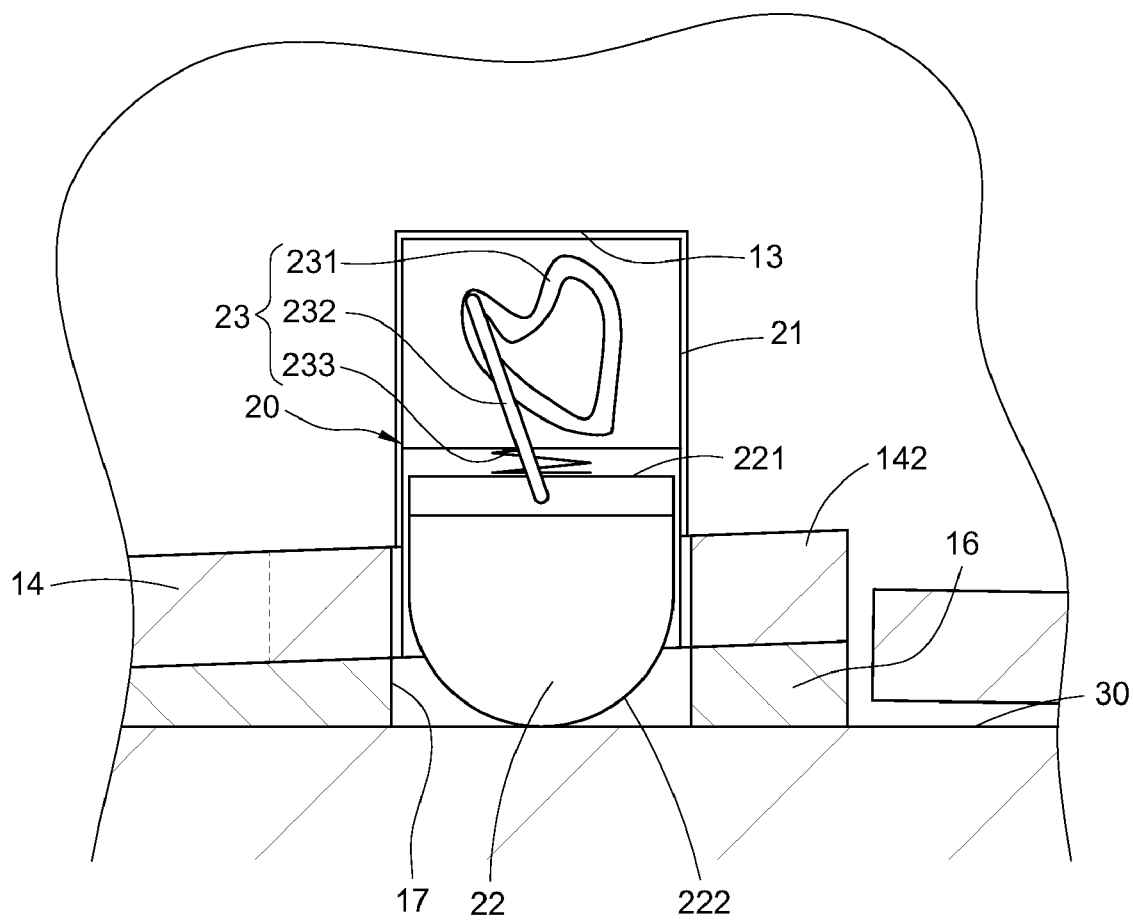
FIG. 4B is a partial schematic enlarged view of the movable member according to the present invention before the movable member is actuated.
Figure 6:
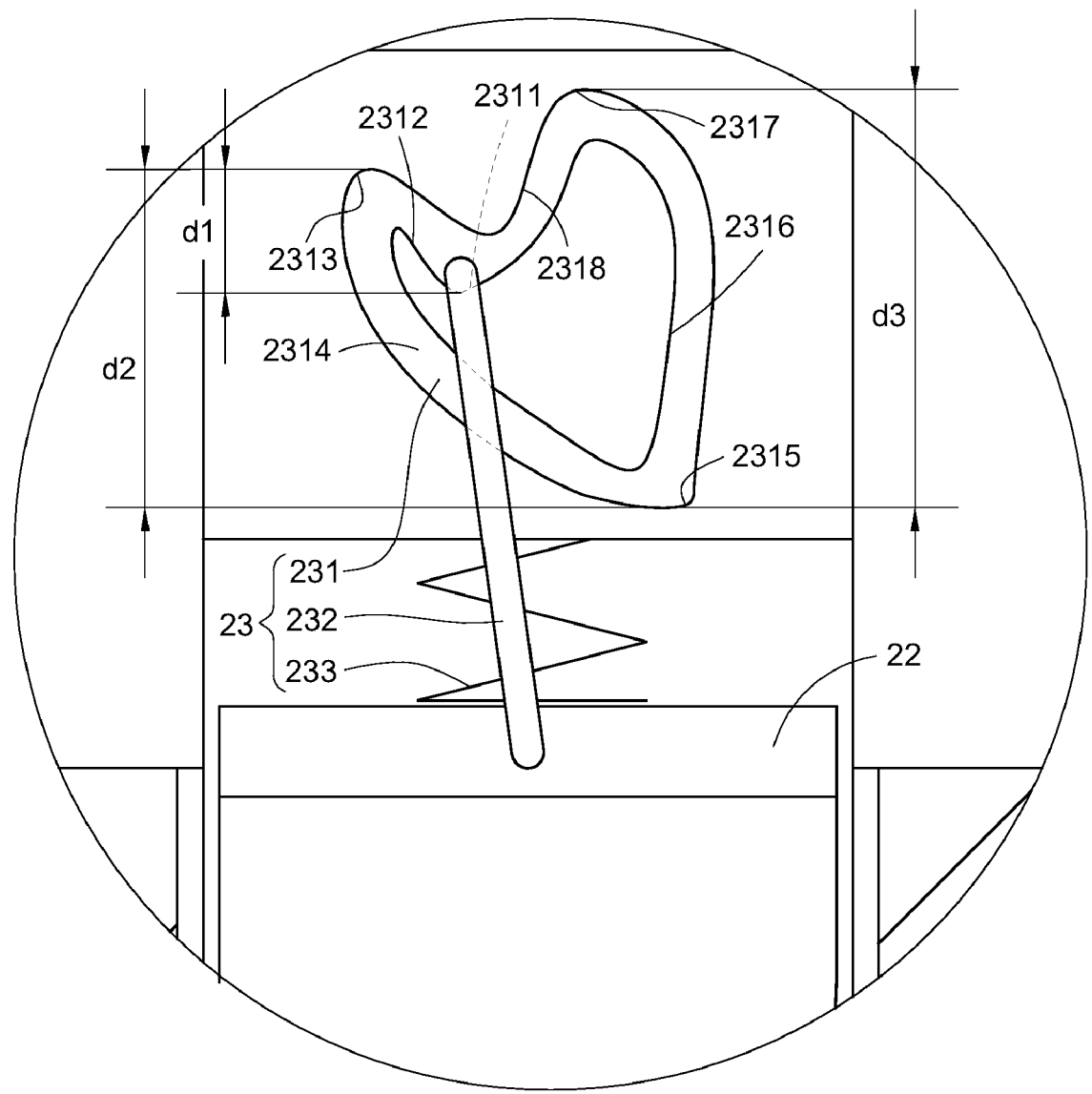
FIG. 6 is a partial schematic enlarged view of the circulating guide groove according to the present invention.

At this time, the guide rod 232 is pushed by the movable member 22 to leave the first positioning end 2311 of the circulating guide groove 231, and has a displacement of a first distance d1 along a first sloped protrusion 2312, and then is stopped by a first blocking end 2313 (as shown in FIG. 4B). The first distance d1 is equivalent to the distance between the first position and the second position of the movable member 22 (as shown in FIG. 6). Further, in the process when the guide rod 232 moves to the first blocking end 2313, the movable member 22 presses the elastic element 233 in the cylinder 21, and the elastic element 232 has a compressive deformation.

Figure 4C:
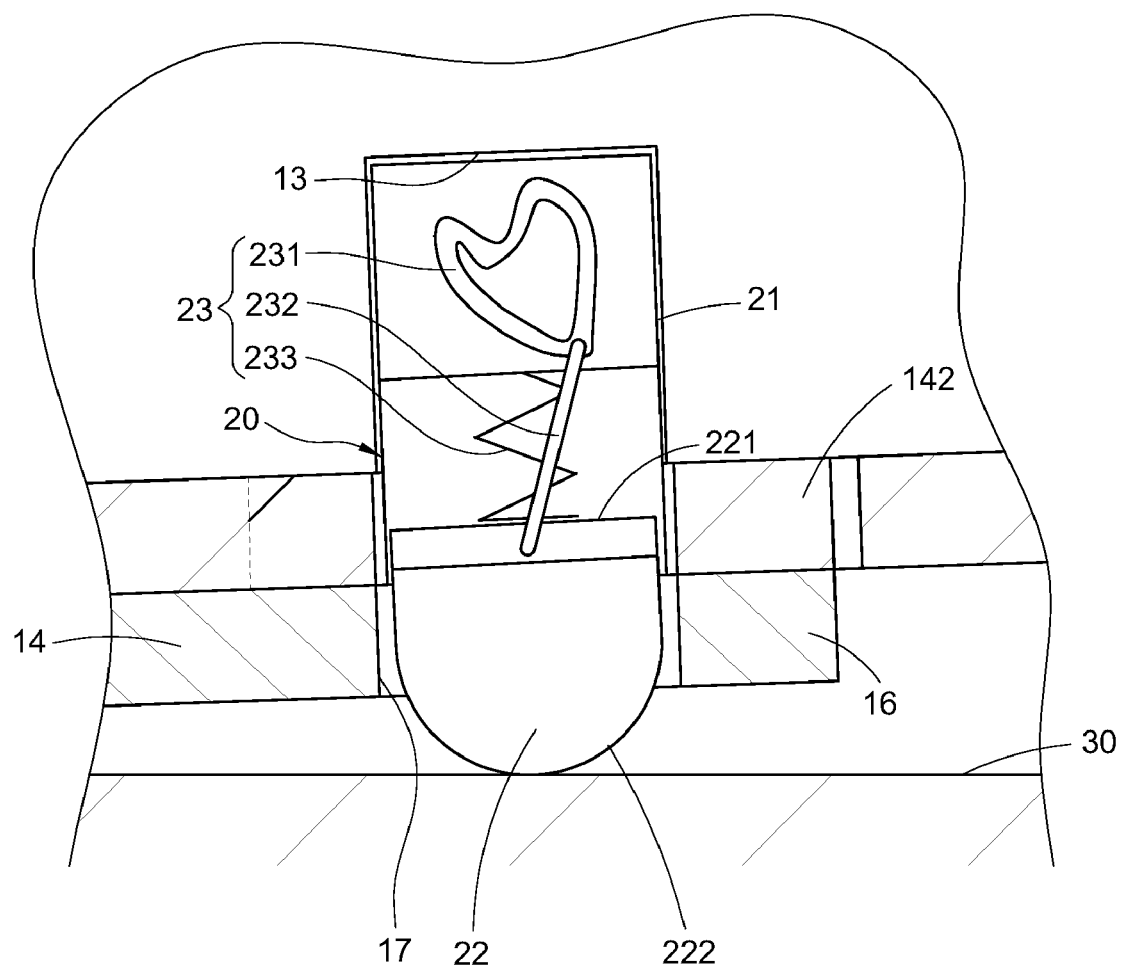
FIG. 4C is a partial schematic enlarged view of the movable member according to the present invention when the movable member is actuated.

In a third motion state, when the user releases the pressing force on the casing 10, the pressed elastic element 233 is released, and the resilient force of the elastic element 233 drives the guide rod 232 to have a displacement of a second distance d2 along a slide rail 2314 and stop at a second positioning end 2315 (as shown in FIG. 4C). Meanwhile, the elastic element 233 pushes the movable member 22 to have a displacement to a third position outside the cylinder 21 (released position). The second distance d2 is equivalent to the distance between the second position and the third position of the movable member 22 (as shown in FIG. 6). Thus, the first pressing and release motion is completed.

When the movable member 22 moves to the third position, the movable member 22 supports the casing 10 higher, such that the slide-proof pad 16 leaves the contact with the plane 30, and the contact surface 222 having a low friction coefficient of the movable member 22 has a point contact with the plane 30. The user may push the casing 10, and the rolling component 12 and the movable member 22 drive the casing 10 to have a sliding displacement on the plane 30, so as to adjust the position of the casing 10. Thus, through the contact between the slide-proof pad 16 and the plane 30, the rolling component 12 may be in a fixed state, or the movable member 22 supports the slide-proof pad 16 higher to leave the plane 30, such that the rolling component 12 is in a free state. Therefore, the casing 10 of the electronic device may be moved or fixed.

In a fourth motion state, when the casing 10 is to be fixed on the plane 30, the edge of the casing 10 may be pressed again, such that the movable member 22 moves towards the internal of the cylinder 21. The pressing force makes the movable member 22 return to the first position (normal state), and presses the elastic element 233 inwards to a compressed state. At this time, the movable member 22 may drive the guide rod 232 to be detached from the second positioning end 2315, move upwards for a third distance d3 along a second sloped protrusion 2316, and then be stopped by a second blocking end 2317. After that, the pressing force may be released, such that the guide rod 232 moves beyond a third sloped protrusion 2318, and slides to the first positioning end 2311 again. The third distance d3 is equivalent to the distance between the third position and the first position of the movable member 22 (as shown in FIG. 6). Thus, a second pressing and positioning motion is completed. The twice pressing mode forms a release and positioning circulation of the movable member 22.

In addition, in the above embodiment, the movable member 22 is made of a material having a low friction coefficient, such that the contact surface 222 of the movable member 22 forms a point contact on the plane 30, and the contact surface 222 makes the movable member 22 have a sliding displacement on the plane 30. The movable member 22 may further include a ball to replace the contact surface 222. The ball is disposed on the bottom of the movable member 22, and may freely rotate on the bottom of the movable member 22, such that the movable member 22 has a sliding displacement on the plane 30 through the ball. Such simple structural variations and substitutions shall be covered by the claims of the present invention.

The electronic device having a sliding assembly of the present invention has the following efficacy. After the casing is placed on a plane, a pressing force may be applied on a side edge of the casing; the cantilever disposed on the bottom surface of the casing makes the slide-proof pad retract to the evading position in the casing, and pushes the movable member to have a displacement relative to the cylinder, such that the movable member extends outside the slide-proof pad and supports the casing higher. Thus, the user may slide the casing on the plane through the movable member. When the casing is to be fixed, the casing only needs to be pressed once again to make the movable member retract into the slide-proof pad, and the slide-proof pad fixes the casing at the optimal using position on the plane.

What is claimed is:

1. An electronic device having a sliding assembly, enabling the electronic device to have a sliding contact or an interference contact with a plane, comprising:

a casing, having a bottom surface, wherein at least one groove is disposed on the bottom surface, a cantilever that may have a swing displacement is corresponding to the groove, the cantilever has a through hole, and a slide-proof pad is disposed on the cantilever, the cantilever has a blocked position where the slide-proof pad contacts with the plane, and an evading position where the slide-proof pad retracts into the casing; and a sliding assembly, disposed in the casing, and corresponding to the cantilever, wherein the sliding assembly comprises:

a cylinder, fixed to the casing; and a movable member, movably disposed on the cylinder and corresponding to the through hole, wherein the movable member moves to a first position, a second position, and a third position relative to the cylinder; when the movable member is at the first position, the cantilever makes the slide-proof pad remain at the blocked position; when the movable member is at the second position, the cantilever makes the slide-proof pad remain at the evading position; when the movable member is at the third position, the movable member supports the casing higher, such that the slide-proof pad leaves the plane, and the movable member and the plane have the sliding contact.

2. The electronic device having a sliding assembly according to claim 1, wherein the casing further comprises a rolling component, the rolling component is disposed on the bottom surface, and is freely rotatable relative to the bottom surface, and the rolling component and the groove are located on two opposite sides of the bottom surface.

3. The electronic device having a sliding assembly according to claim 1, wherein the bottom surface further comprises a cut groove, the cut groove is disposed around the cantilever, and the cantilever has the swing displacement through the cut groove.

4. The electronic device having a sliding assembly according to claim 1, wherein the sliding assembly further comprises a telescopic component, and the telescopic component further comprises:

a circulating guide groove, disposed on an internal side wall of the cylinder;

a guide rod, having one end connected to the movable member, and the other end movably located in the circulating guide groove to have a reciprocal displacement; and an elastic element, normally pushing the movable member towards the second position.

5. The electronic device having a sliding assembly according to claim 1, wherein the movable member is made of a material having a low friction coefficient, a side of the movable member has a contact surface, and the contact surface forms a point contact on the plane.

6. The electronic device having a sliding assembly according to claim 1, wherein the movable member further comprises a ball, and the ball is disposed on a bottom of the movable member and is freely rotatable relative to the bottom, and forms a point contact on the plane.

7. The electronic device having a sliding assembly according to claim 1, wherein the slide-proof pad protrudes from the bottom surface of the casing.

8. The electronic device having a sliding assembly according to claim 1, wherein the slide-proof pad is made of a material having a high friction coefficient.

* * * * *